United States Patent
Kobayashi

Patent Number: 5,773,898
Date of Patent: Jun. 30, 1998

[54] HYBRID INTEGRATED CIRCUIT WITH A SPACER BETWEEN THE RADIATOR PLATE AND LOADING PORTION OF THE IC

[75] Inventor: Eiji Kobayashi, Tokyo, Japan

[73] Assignee: Mitsubishi Denki Kabushiki Kaisha, Tokyo, Japan

[21] Appl. No.: 756,649

[22] Filed: Nov. 26, 1996

[30] Foreign Application Priority Data

May 27, 1996 [JP] Japan ..................................... 8-131995

[51] Int. Cl.⁶ .............................. H01L 23/34; H05K 7/20
[52] U.S. Cl. ......................... 257/783; 257/712; 257/713; 361/702; 361/704; 361/707
[58] Field of Search .................................... 257/712, 713, 257/772, 783, 796, 705, 706; 361/676, 704, 702, 707

[56] References Cited

U.S. PATENT DOCUMENTS 4,504,849  3/1985  Davies et al. ........................... 257/772

Primary Examiner—Carl W. Whitehead, Jr.

[57] ABSTRACT

A hybrid integrated circuit is provided with a radiator plate having a power device fixed at the surface through a spacer. As the spacer for preventing heat transfer from the radiator plate to the substrate, the solder layer has at least one supporting element selected from the group consisting of (1) globular metal grains of 80 to 1200 µm in diameter uniformly distributed therein, (2) a first solder layer of 50 to 200 µm applied on the lower surface of the radiator, and (3) a dummy layer of 80 to 150 µm high including at least one selected from the group consisting of a resistor layer, conductive layer and a glass layer on the radiator loading part.

13 Claims, 4 Drawing Sheets

PRIOR ART

HYBRID INTEGRATED CIRCUIT WITH A SPACER BETWEEN THE RADIATOR PLATE AND LOADING PORTION OF THE IC

BACKGROUND OF THE INVENTION

1. Field of the Invention

The present invention relates generally to a hybrid integrated circuit and a method of preparing the same.

2. Description of Related Art

Power devices 7 such as power transistors generate great heat during operation. Therefore, a radiator plate 5 of Cu is designed to be attached to a lower surface of the power device by a solder material 6. As shown in FIG. 4, in case of the power device used as an element of a hybrid integrated circuit, the hybrid integrated circuit can be prepared as follows.

First, a solder paste is applied on a loading portion 2 of a thick film substrate 1 for the hybrid integrated circuit by means of printing as shown in FIGS. 4A and 4B.

Second, a radiator plate 5 having a power device 7 fixed is positioned on the solder paste 4 as shown in FIG. 4C and then the substrate 1 is heated up to a temperature more than the melting point of the solder to melt the solder and fix the radiator plate 5 on the loading portion 2 by a solder layer 4'.

Finally, an electrode 8 on the power device 7 is connected to a wiring electrode 3 on the substrate 1 to give the hybrid integrated circuit as shown in FIG. 4E.

Therefore, in the conventional structure, the space between the radiator plate 5 and the loading portion 2 is defined by the thickness of the solder layer 4', generally less than 50 $\mu$m, so that the heat caused by the power device operation was transferred through the radiator paste 5 to the substrate 1. Due to the difference of coefficient of heat linear expansion between the radiator plate 5 and the substrate 1, during a heat cycle of temperature increasing and decreasing, loads happen on the solder layer and cracks occur which results in failure of the hybrid integrated circuit. Further, the cracks are easy to generate at a position where the radiator 5 and the loading portion 2 are closer because it is difficult to arrange the radiator plate 5 in a parallel manner to the loading portion.

According to Japanese Patent Kokai 1-278051, there is proposed a spacer arrangement on the loading portion 2 before the radiator loading. In fact, the spacer must be as small as about 100 $\mu$m, so that it is very difficult in the hybrid integrated circuit to arrange such a small spacer precisely on the loading portion.

SUMMARY OF THE INVENTION

The present invention has been developed to overcome the above-described difficulty.

It is accordingly an objective of the present invention to provide a hybrid integrated circuit having a radiator plate arranged at small and substantially parallel intervals on the loading portion of a substrate.

Another objective of the present invention is to provide a method of preparing a hybrid integrated circuit having a radiator plate arranged at small and substantially parallel intervals on the loading portion of a substrate.

In accomplishing the above and other objectives, according to a first aspect of the present invention, there is provided a hybrid integrated circuit, comprising a substrate having a radiator plate loading portion and a radiator plate having a power device fixed at the surface, said radiator plate being fixed on said loading portion by a solder layer wherein as a spacer between said radiator plate and said loading portion, said solder layer has at least one supporting means selected from the group consisting of (1) globular metal particles of 80 to 200 $\mu$m in diameter uniformly distributed therein, (2) a first solder layer of 50 to 200 $\mu$m thick applied on a lower surface of said radiator plate, and (3) a dummy layer of 80 to 150 $\mu$m thick comprising at least one selected from the group consisting of a resistor layer, a conductive layer and a glass layer on said radiator loading portion by printing.

According to a second aspect of the present invention, there is provided three method of preparing a hybrid integrated circuit.

The first method comprises the steps of:

providing a solder paste comprising solder particles, a flux agent, and globular metal particles having a higher melting point than that of said solder particles and an average diameter of 80 to 200 $\mu$m;

coating said solder paste on a loading portion of a substrate where a radiator plate is loaded, to thereby form a solder paste layer on that loading portion;

positioning said radiator plate having a power device fixed at one surface thereof, on said solder paste layer;

heating said substrate to melt the solder particles of the paste layer and fix the radiator plate on said loading portion while leaving the globular metal particles as a spacer between said radiator plate and said loading portion.

According to the first method invention, if the solder paste is applied on the loading portion by a conventional coating method, there is given a precise and parallel gap between the radiator plate and the loading portion because the solder layer therebetween has a mass of spheroidal metal particles dispersed uniformly.

In carrying out the first method, there may be used a solder paste which is prepared by mixing spheroidal solder particles with a mass of spheroidal metal particles each having an average diameter within the range of 80 to 200 microns and also having a melting point higher than that of the solder particles, said spheroidal metal particles being uniformly dispersed in said solder particles.

The second method comprises the steps of:

providing a radiator plate having a power device fixed at the upper surface and a first solder layer of 50 to 200 $\mu$m thick at the lower surface;

coating a second solder paste on a loading portion of a substrate where a radiator plate is loaded, to thereby form a second solder layer on that loading portion;

positioning said radiator plate through said first solder layer on said second solder layer, and heating said substrate to melt said second solder layer and fix the radiator plate through said first solder layer as a spacer on said loading portion.

According to the second method invention, if the first solder paste is applied at the lower surface of the substrate by a conventional coating method, there is given a substantially parallel gap between the radiator plate and the loading portion because the first solder layer therebetween has a higher melting point, so that it can be left as it is without melting during the second solder welding process.

The third method comprises steps:

forming a dummy layer of 80 to 150 $\mu$m thick as a spacer on a portion of a substrate where a radiator plate is loaded, by means of printing at least one selected from the group consisting of a resistor layer, a conductive layer and a glass layer on said loading portion, applying a solder paste on said loading portion, to thereby form a solder paste layer on that loading portion;

positioning said radiator plate having a power device fixed at the upper surface on said solder paste layer, and heating said substrate to melt said solder paste layer and fix the radiator plate through said dummy layer on said loading portion.

According to the third method invention, if the dummy layer is formed on the loading portion by a conventional printing method, there is easily given a substantially parallel gap between the radiator plate and the loading portion.

As the hybrid integrated circuit according to the present invention has a precise and substantially parallel gap within 80 to 200 μm between the radiator plate and the loading portion, the parallel gap prevents heat transferring from the radiator palate to the substrate and thus decreasing load caused by the heat cycle which leads to a failure of the solder layer therebetween.

BRIEF DESCRIPTION OF THE DRAWINGS

The above and other objectives and features of the present invention will become more apparent from the following description of a preferred embodiment thereof with reference to the accompanying drawings, throughout which like parts are designated by like reference numerals, and wherein.

DETAILED DESCRIPTION OF THE PREFERRED EMBODIMENTS

EMBODIMENT 1

In this embodiment, there is used a solder paste, which is prepared by mixing globular solder particles with a mass of globular metal particles 10 each having an average diameter of about 80 μm and also having a melting point higher than that of the solder particles, said globular metal particles being uniformly dispersed in said solder particles. Examples of the solder paste include 90% solder particles and 10% flux agent, and as the globular solder particles, the solder paste may be mixed with solder particles having a higher melting point than that of matrix solder particles.

Figure 1A:
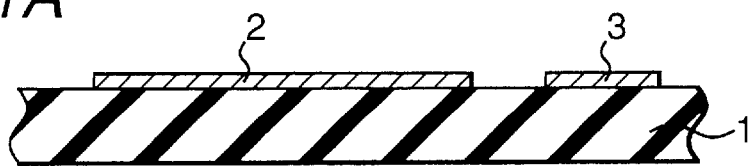
FIGS. 1A, 1B, 1C, 1D and 1E are sectional views each showing each steps of the method for preparing a hybrid integrated circuit according to a first embodiment of the present invention.
Figure 1B:
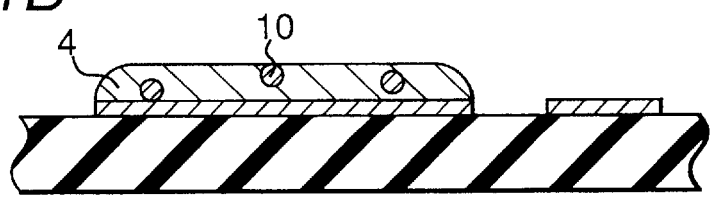
Figure 1C:
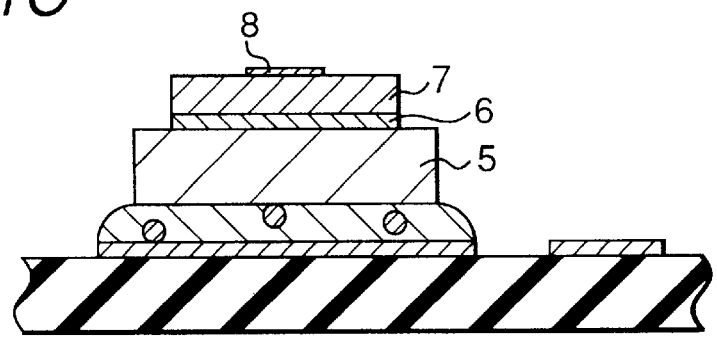

As shown in FIGS. 1A and 1B, the solder paste 4 is applied on a loading portion 2 of a thick film substrate 1 by a method of printing with a metal mask, and then as shown in FIG. 1C on the surface of the loading portion 2, there is positioned a radiator plate 5 having a power device 7 fixed thereon through a solder layer 6.

Figure 1D:
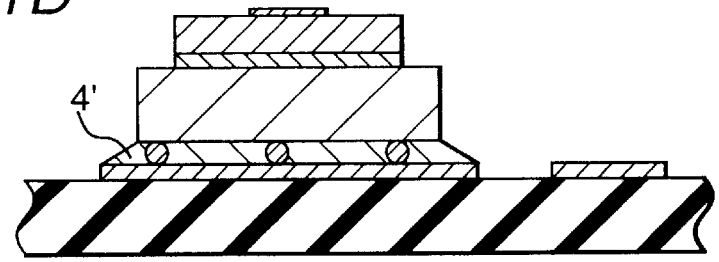

As shown in FIG. 1D, the thick film substrate 1 provided with the radiator plate 5 is heated up to about 200° C. to melt the solder material in the solder paste 4 and fix the radiator plate 2 on the substrate 1. During the reflowing process, the solder material melts and the metal particles 10 do not melt, so that the metal particles 10 is positioned as a spacer between the radiator plate 5 and the loading portion 2. The radiator plate 5 and the loading portion 2 are welded by the solder material provided with the metal particles uniformly distributed in the solder material, the radiator plate 5 is fixed parallel to the loading portion at intervals of 80 μm of the metal particle diameter.

Figure 1E:
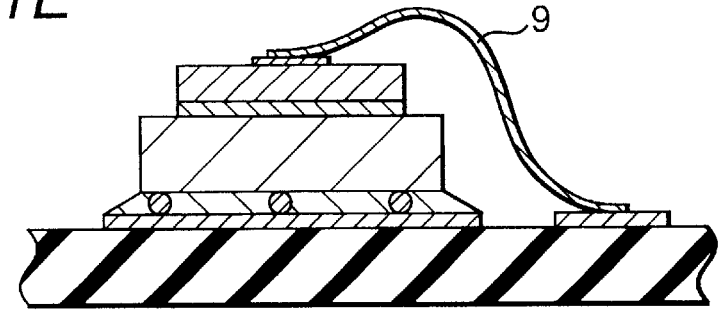

As shown in FIG. 1E, an electrode 8 of the power device 7 is connected to a wiring electrode 3 on the substrate 1 to give a perfect hybrid integrated circuit.

In the resulting hybrid integrated circuit, the radiator plate 5 is positioned at precise intervals of 80 μm on the loading portion 2, which prevent the heat transfer from the radiator plate 5 to the loading portion 2, resulting in decreasing load plate due to the heat cycle and thus no failure of the hybrid integrated circuit due to damage of the solder layer 4'.

According to the first embodiment of the present invention, the reflowing process for making a precise space between the radiator plate and the loading portion is easy to be applied to another hybrid integrated circuits having a different loading position of the radiator plate 5. Further, the space between the radiator plate 5 and the loading portion 2 is adjustable by using another metal particles having a different diameter.

EMBODIMENT 2

In this embodiment, a solder paste having a high melting point solder component (about 300° C.) is applied to both surfaces of radiator plate 5. On the upper solder layer, there is positioned a power device 7 which is subject to a reflowing process. The radiator plate 5 is heated up to about 300° C. to melt the high melting point solder component and fix the power device 7 on the upper solder layer while forming the solder layer 6' having a thickness of 50 μm on the lower solder layer (not shown).

Figure 2A:
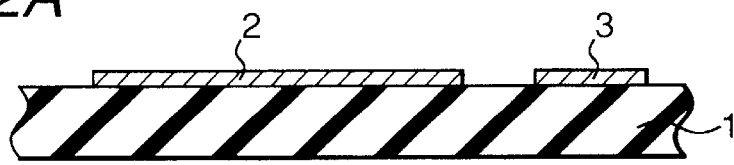
FIGS. 2A, 2B, 2C, 2D and 2E are sectional views each showing each steps of the method for preparing a hybrid integrated circuit according to a second embodiment of the present invention.
Figure 2B:
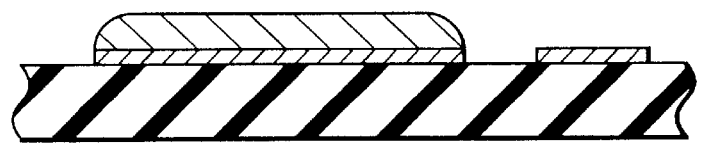
Figure 2C:
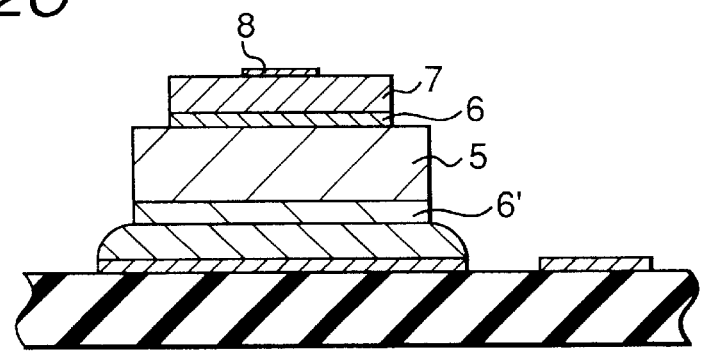

As shown in FIGS. 2A and 2B, a solder paste 4 having a lower melting point component is applied on the loading portion of the thick film substrate to form a second solder layer and as shown in FIG. 2C a radiator plate 5 is positioned through the lower solder layer 6' on the second solder layer.

Figure 2D:
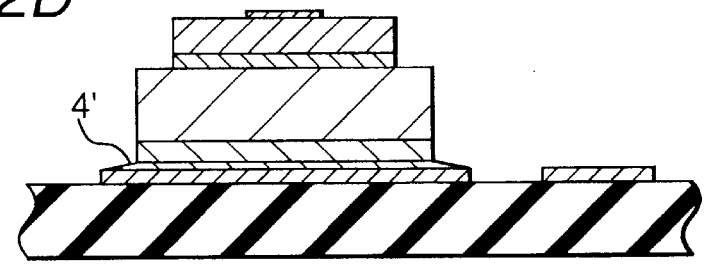

As shown in FIG. 2D, the radiator 5 and the substrate 1 are heated up to about 200° C. to melt the second solder layer without melting the solder layers 6 and 6'. Between the radiator plate 5 and the loading portion 2, there is left the first solder layer 6' of 50 μm and is formed the second solder layer 4', so that the total space therebetween will be about 80 μm.

Figure 2E:
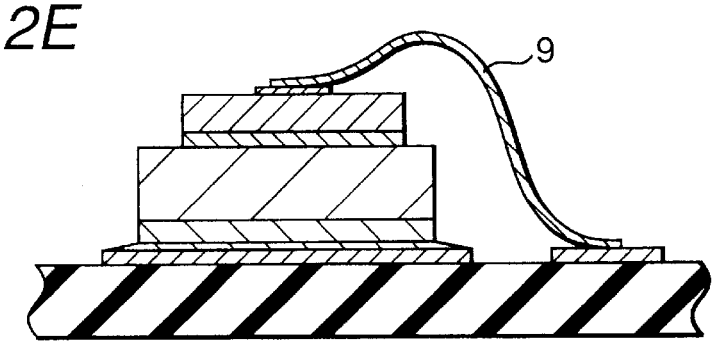

Finally as shown in FIG. 2E, an electrode 8 of the power device 7 is connected to a wiring electrode 3 by an aluminum wiring 9 on the substrate 1 to give a perfect hybrid integrated circuit.

According to the second embodiment of the present invention, the conventional welding step is able to make a substantially parallel space between the radiator plate and the loading portion. Thereby, the heat transfer from the radiator plate 5 to the loading portion 2 can be prevented, resulting in decreasing load due to the heat cycle and thus no failure of the hybrid integrated circuit due to damage of the solder layers 4' and 6'.

EMBODIMENT 3

In this embodiment, there is used a dummy layer having a thickness of 80 μm and acting as a spacer between the radiator plate 5 and the loading portion 2, which comprises a resistor layer such as $RuO_2$ layer, a conductive layer such as AgPd for wiring and a glass layer such as $SiO_2$ for covering the surface. Each layers can be formed selectively by a method of printing with use of a metal mask. Each layers may have a thickness of about 10 to 20 μm. The resistor layer sometimes consists of more than three kinds of layers.

Figure 3A:
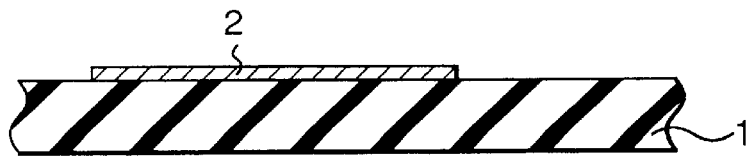
FIGS. 3A, 3B, 3C, 3D, 3E, 3F and 3G are sectional views each showing each steps of preparing a hybrid integrated circuit according to a third embodiment of the present invention.
Figure 3B:
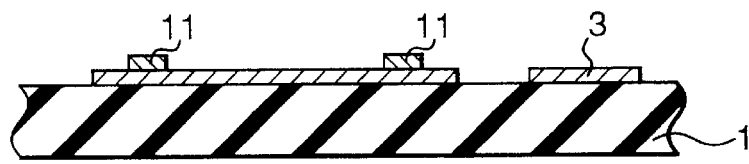
Figure 3C:
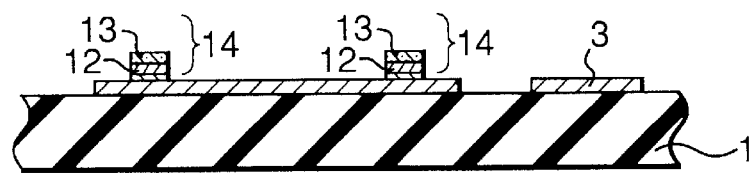

According to this embodiment, as shown in FIGS. 3A to 3C, a resistor layer 11, a conductive layer 12 and a glass layer 13 are formed in turn on at least three spots of the loading portion 2 of the thick film substrate 1 where the resistor layer and so on are not needed, to give a spacer 14 between the radiator plate 5 and the loading portion 2.

Figure 3D:
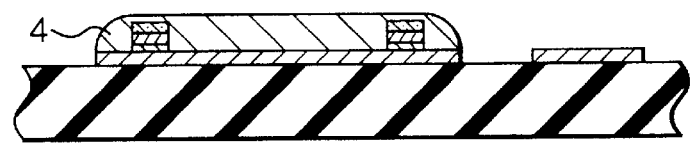
Figure 3E:
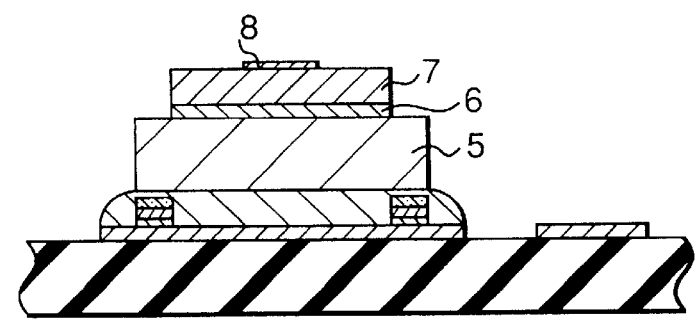
Figure 3F:
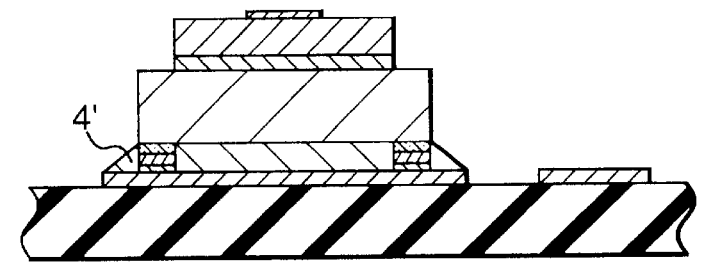

Next, as shown in FIG. 3D, after forming more than 3 spacers 14, a solder paste 4 is applied on the loading portion 2 and as shown in FIGS. 3E and 3F, the radiator plate 5 is positioned and subject to a reflowing process to fix the radiator plate 5 at intervals of the spacers 14 parallel to the loading portion 2. The height of the spacer is adjustable by number of the laminated resistor layers 11.

Figure 3G:
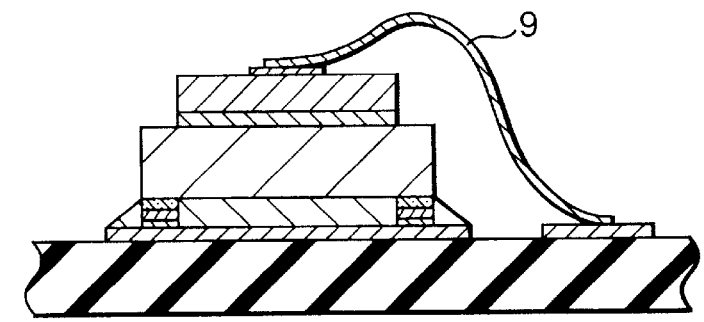
Figure 4A:
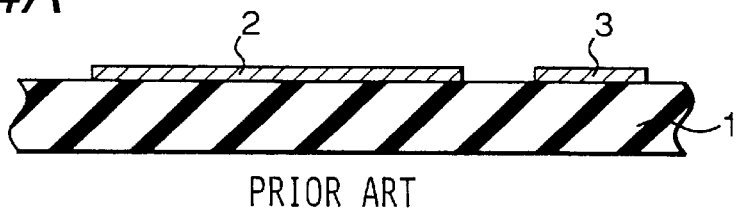
FIGS. 4A, 4B, 4C, 4D and 4E are sectional views each showing the conventional steps of preparing a hybrid integrated circuit.
Figure 4B:
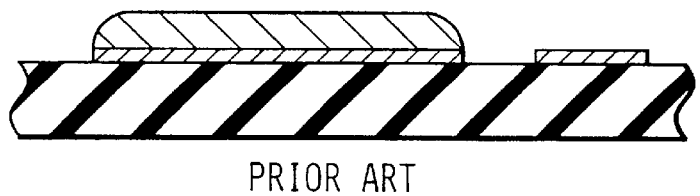
Figure 4C:
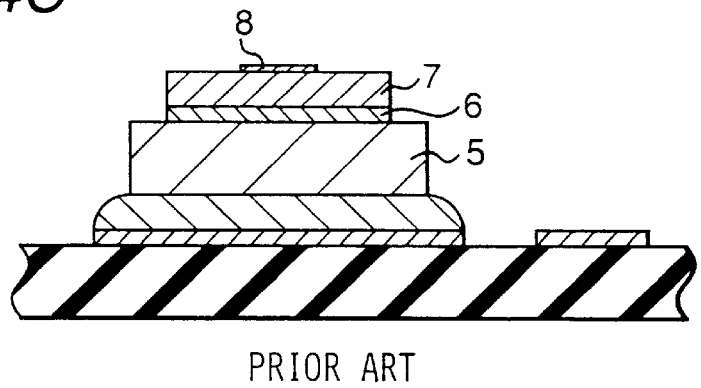
Figure 4D:
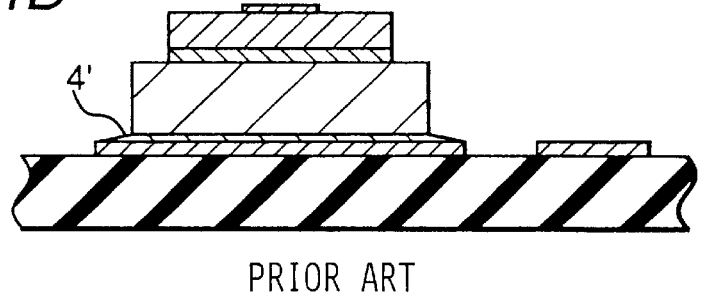
Figure 4E:
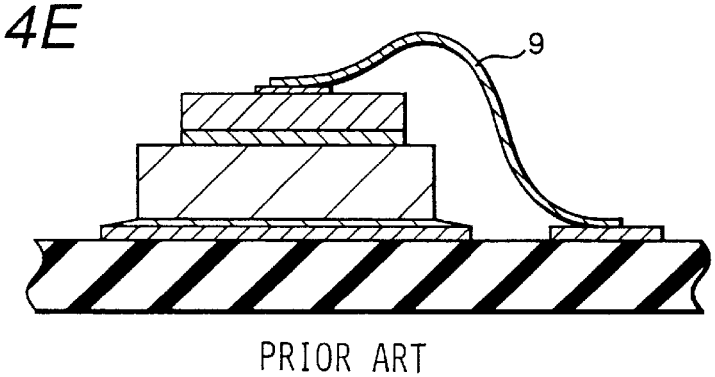

Finally as shown in FIG. 3G, an electrode 8 of the power device 7 is connected to a wiring electrode 3 by an aluminum wiring 9 on the substrate 1 to give a perfect hybrid integrated circuit.

According to the third embodiment of the present invention, the conventional printing step is able to make a substantially parallel space of about 80 μm between the radiator plate and the loading portion. Thereby, the heat transfer from the radiator plate 5 to the loading portion 2 can be prevented, resulting in decreasing load due to the heat cycle and thus no failure of the hybrid integrated circuit due to damage of the solder layers 4'. Further, a special spacer forming step is not needed.

Although the present invention has been fully described by way of examples with reference to the accompanying drawings, it is to be noted here that various changes and modifications will be apparent to those skilled in the art. Therefore, unless such changes and modifications otherwise depart from the spirit and scope of the present invention, they should be construed as being included therein.

What is claimed is:

1. A hybrid integrated circuit comprising:

a substrate;

a loading portion affixed to an upper surface of said substrate;

a radiator plate attached to said loading portion;

a first solder layer positioned between said loading portion and said radiator plate;

a transistor attached to an upper surface of said radiator plate; and a spacer layer for maintaining a predetermined gap between said radiator plate and said loading portion, said spacer layer including one of (1) a plurality of globular metal particles distributed within said first solder layer, (2) a high melting point solder layer positioned between said first solder layer and said radiator plate, and (3) a dummy layer formed of a plurality of stacked elements within said first solder layer.

2. The device according to claim 1, wherein said spacer layer includes a plurality of globular metal particles distributed within said first solder layer.

3. The device according to claim 2, wherein said globular metal particles each have a diameter of 80 μm to 200 μm.

4. The device according to claim 2, wherein said globular metal particles are distributed uniformly within said solder layer.

5. The device according to claim 1, wherein said spacer layer forms a parallel gap between said radiator plate and said loading portion.

6. The device according to, claim 1, wherein said spacer layer includes a high melting point solder layer positioned between said first solder layer and said radiator plate.

7. The device according to claim 6, wherein a second high melting point solder layer is positioned between the upper surface of said radiator plate and said transistor.

8. The device according to claim 6, wherein said high melting point solder layer has a thickness of 50 μm to 200 μm.

9. The device according to claim 1, wherein said spacer layer includes a dummy layer formed of a plurality of stacked elements within said first solder layer.

10. The device according to claim 9, wherein said stacked elements each include a conductive layer positioned between at least one resistor layer and a glass layer.

11. The device according to claim 10, wherein the height of said dummy layer is determined by the number of resistor layers included within said stacked elements.

12. The device according to claim 10, wherein said dummy layer has a thickness in the range of 80 μm to 150 μm.

13. The device according to claim 9, wherein said dummy layer includes a plurality of spacers each having a conductive layer positioned between at least one resistor layer and a glass layer.

* * * * *